United States Patent
Wu et al.

(10) Patent No.: US 7,629,209 B2
(45) Date of Patent: Dec. 8, 2009

(54) METHODS FOR FABRICATING POLYSILICON FILM AND THIN FILM TRANSISTORS

(75) Inventors: YewChung Sermon Wu, Taichung (TW); Chih-Yuan Hou, Chiayi (TW); Guo-Ren Hu, Taipei County (TW); Po-Chih Liu, Taipei County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 336 days.

(21) Appl. No.: 11/163,397

(22) Filed: Oct. 17, 2005

(65) Prior Publication Data

US 2007/0087485 A1 Apr. 19, 2007

(51) Int. Cl.
*H01L 21/84* (2006.01)
(52) U.S. Cl. .............. 438/166; 117/8; 257/66; 257/75; 257/E21.413; 438/455; 438/456; 438/486; 438/487; 438/977
(58) Field of Classification Search .......... 438/166, 438/455, 456, 458, 487, 977; 117/7, 8; 257/66, 257/75, E21.413
See application file for complete search history.

(56) References Cited

U.S. PATENT DOCUMENTS

| | | | | |
|---|---|---|---|---|
| 5,164,218 A * | 11/1992 | Tsuruta et al. | .............. | 438/405 |
| 5,310,446 A * | 5/1994 | Konishi et al. | ................ | 117/58 |
| 5,827,773 A | 10/1998 | Voutsas | ...................... | 438/488 |
| 5,930,651 A * | 7/1999 | Terasawa | ................... | 438/456 |
| 6,054,370 A * | 4/2000 | Doyle | .......................... | 438/456 |
| 6,143,629 A * | 11/2000 | Sato | ........................... | 438/455 |
| 6,191,007 B1 * | 2/2001 | Matsui et al. | ............... | 438/459 |
| 6,372,558 B1 * | 4/2002 | Yamanaka et al. | .......... | 438/149 |
| 6,451,668 B1 * | 9/2002 | Neumeier et al. | .......... | 438/401 |
| 6,727,549 B1 * | 4/2004 | Doyle | ......................... | 257/347 |
| 6,905,800 B1 * | 6/2005 | Yuen et al. | ..................... | 430/5 |
| 7,052,948 B2 * | 5/2006 | Murphy et al. | ............. | 438/219 |
| 2002/0132448 A1 * | 9/2002 | Lim et al. | .................. | 438/456 |

(Continued)

FOREIGN PATENT DOCUMENTS

CN 1567550 1/2005

(Continued)

OTHER PUBLICATIONS

Article titled "Formation of location-controlled crystalline islands using substrate-embedded seeds in excimer-laser crystallization of silicon films" jointly authored by Paul et al. Applied Physics Letters vol, 79, No. 12, pp. 1819-1821, Sep. 17, 2001.

(Continued)

*Primary Examiner*—M. Wilczewski
(74) *Attorney, Agent, or Firm*—Jianq Chyun IP Office

(57) ABSTRACT

A method for fabricating polysilicon film is disclosed. First, a first substrate is provided, wherein a plurality of sunken patterns has been formed on the front surface of the first substrate. Then, a second substrate is provided and an amorphous polysilicon film is formed on the second substrate. Next, the amorphous polysilicon film formed on the second substrate is in contact with the front surface of the first substrate. The amorphous polysilicon film is transferred into a polysilicon film by performing an annealing process. Then, the first substrate and the second substrate are separated from each other. This method reduces the cost and the time for fabricating polysilicon film.

15 Claims, 12 Drawing Sheets

U.S. PATENT DOCUMENTS

| | | | |
|---|---|---|---|
| 2004/0016967 A1* | 1/2004 | Yamazaki et al. | 257/347 |
| 2004/0060900 A1* | 4/2004 | Waldhauer et al. | 216/2 |
| 2004/0224480 A1* | 11/2004 | Forbes | 438/455 |
| 2004/0263705 A1* | 12/2004 | Seo et al. | 349/43 |
| 2005/0032285 A1* | 2/2005 | Imahara et al. | 438/166 |
| 2007/0200144 A1* | 8/2007 | Aspar et al. | 257/194 |

FOREIGN PATENT DOCUMENTS

| | | |
|---|---|---|
| JP | 09-186086 | 7/1997 |
| TW | 91132242 | 10/2002 |
| TW | 91137219 | 12/2002 |

OTHER PUBLICATIONS

Goldsmid et al., "Thermal Conductivity of Amorphous Silicon", phys. stat. sol. (a) 76, K31 (1993), School of Physics, University of New South Wales, Kensington.

* cited by examiner

METHODS FOR FABRICATING POLYSILICON FILM AND THIN FILM TRANSISTORS

BACKGROUND OF THE INVENTION

1. Field of Invention

The present invention relates to a method for fabricating polysilicon film and a method for fabricating thin film transistors using the described method, and particularly to a method using heterogeneous growth to fabricate polysilicon film and a method for fabricating thin film transistors using the described method.

2. Description of the Related Art

Display devices are interface between people and information. Presently, flat displays are the new trend on the development of technology. Flat displays mainly include organic electro-luminescence display (OELD), plasma display panel (PDP), liquid crystal display (LCD) and light emitting diode (LED) etc.

Thin film transistors (TFT) can be used as driving elements of the above-mentioned displays. In general, TFTs can be distinguished into amorphous silicon TFTs (a-TFT) and low-temperature polysilicon thin film transistors (LTPS-TFT) according to the materials of the channel layer. Wherein, an LTPS-TFT is formed by a technique that is better than the traditional technique of forming amorphous TFTs. Because the electronic mobility of the LTPS-TFTs can be reached up to or over 200 cm2/V-sec, the area of the TFTs can be decreased so as to conform to the high aperture requirement of displays. As a result, the brightness of displays can be increased and the entirely power consumption can be decreased. In addition, due to the improvement of the electronic mobility, partial driving circuits of displays can be formed on the substrate, so-called chip on glass (COG), during the manufacturing process so as to significantly reduce the fabricating cost of display panels.

It should be noted that the channel layer of LTPS TFT is composed of polysilicon film formed by excimer laser annealing (ELA). Therefore, heterogeneous growth method is usually used for forming polysilicon film with better quality, less defect and larger grain.

FIG. 1A to FIG. 1E are cross-sectional diagrams of the procedures of using conventional heterogeneous growth method to form polysilicon film. Referring to FIG. 1A, a substrate 100 is provided first, and sunken patterns 110 are formed on the substrate 100. Wherein, the method for fabricating the sunken patterns 110 may be the conventional photo-lithography and etching process. Then, referring to FIG. 1B, an amorphous silicon film 120 is deposited in the sunken patterns 110. Referring to FIG. 1C, the amorphous silicon film 120 (as shown in FIG. 1B) in the sunken patterns 110 is transferred into a polysilicon film 140 by performing an ELA process 130. Referring to FIG. 1D, another amorphous silicon film 150 is deposited on the substrate 100. Later, referring to FIG. 1E, the amorphous silicon film 150 (as shown in FIG. 1D) is transferred into a polysilicon film 170 by performing another ELA process 160.

In more detail, the polysilicon film 140 formed in the sunken pattern 110 is used as a seed layer. When the ELA process 130 (as shown in FIG. 1E) is performed, because of the difference of the melting points between the amorphous silicon film 150 and the silicon film 140 in the sunken patterns 110, the polysilicon film 140 is used as the seed of the amorphous silicon film 150 for performing heterogeneous growth.

However, the above-mentioned method for fabricating the polysilicon film 170 has to first form sunken patterns 110 on the substrate 100 by performing photo-lithography process, and the polysilicon film 140 used as a seed layer has to be formed in the sunken patterns 110. In other words, the above-mentioned method for fabricating the polysilicon film 170 has to perform the ELA process twice. As a result, it increases the process steps and time.

SUMMARY OF THE INVENTION

Accordingly, an object of the present invention is to provide a method for fabricating polysilicon film, in which the steps and time for fabricating the polysilicon film can be reduced.

Another object of the present invention is to provide a method for fabricating thin film transistors, in which the above-mentioned method for fabricating the polysilicon film is used to reduce the steps and time for fabricating the thin film transistors.

The present invention provides a method for fabricating polysilicon film. First, a first substrate is provided, wherein a plurality of sunken patterns has been formed on the front surface of the first substrate. Then, a second substrate is provided and an amorphous silicon film is formed on the second substrate. Next, the amorphous silicon film formed on the second substrate is in contact with the front surface of the first substrate. The amorphous silicon film is transferred into a polysilicon film by performing an annealing process. Then, the first substrate and the second substrate are separated from each other.

According to an embodiment of the present invention, the heat conductive factor of the foregoing first substrate is larger than that of the amorphous silicon film.

According to an embodiment of the present invention, the material of the foregoing first substrate is selected from the group consisting of silicon materials, metal materials or one of the combinations thereof. Wherein, the silicon materials, for example, include polysilicon or wafer Si; the metal materials, for example, include nickel (Ni) or aluminum (Al).

According to an embodiment of the present invention, the material of the foregoing second substrate includes glass or quartz.

According to an embodiment of the present invention, the foregoing annealing process may be an excimer laser annealing (ELA) process.

According to an embodiment of the present invention, the foregoing method for forming the sunken patterns on the front surface of the first substrate comprises the following steps. First, a photo-resist layer is formed on the first substrate. Then, a photo lithography process using a photo mask is performed to form a patterned photo-resist layer. Next, the first substrate is etched to form the sunken patterns by using the patterned photo-resist layer as a mask.

The present invention also provides a method for fabricating thin film transistors. First, a first substrate is provided, wherein a plurality of sunken patterns has been formed on the front surface of the first substrate. Next, a second substrate is provided and an amorphous silicon film is formed on the second substrate. Then, the amorphous silicon film formed on the second substrate is in contact with the front surface of the first substrate. The amorphous silicon film is transferred into a polysilicon film by performing an annealing process. Then, the first substrate and the second substrate are separated from each other. The polysilicon film formed on the second substrate is patterned to form a polysilicon island. Further, a gate insulating layer is formed to cover the polysilicon island. A gate is formed on the gate insulating layer. A source/drain is formed in the polysilicon island beside the gate, wherein a region between the source and the drain is a channel.

According to an embodiment of the present invention, the heat conductive factor of the foregoing first substrate is larger than that of the amorphous silicon film.

According to an embodiment of the present invention, the material of the foregoing first substrate is selected from the group consisting of silicon materials, metal materials or one of the combinations thereof. Wherein, the silicon materials, for example, include polysilicon or wafer Si; the metal materials, for example, include nickel (Ni) or aluminum (Al).

According to an embodiment of the present invention, the material of the foregoing second substrate includes glass or quartz.

According to an embodiment of the present invention, the foregoing annealing process may be an excimer laser annealing (ELA) process.

According to an embodiment of the present invention, the foregoing method for forming the sunken patterns on the front surface of the first substrate comprises the following steps. First, a photo-resist layer is formed on the first substrate. Then, a photo lithography process using a photo mask is performed to form a patterned photo-resist layer. Next, the first substrate is etched to form the sunken patterns by using the patterned photo-resist layer as a mask.

According to an embodiment of the present invention, the foregoing method for fabricating thin film transistors further comprises the following steps. Firstly, a passivation layer is formed to cover the polysilicon island and the gate. The passivation layer is patterned to expose the source/drain. A source/drain metal layer is formed on the passivation layer, wherein the source/drain metal layer is electrically connected with the exposed source/drain.

The present invention uses the first substrate with sunken patterns as the seed layer, and the amorphous silicon film formed on the second substrate is transferred into a polysilicon film because the heat conductive factor of the first substrate is larger than that of the amorphous silicon film. Therefore, compared with the conventional manufacturing process of polysilicon film, the present invention completes the manufacturing process by using ELA process only once. Furthermore, the first substrate as the seed layer may be used repeatedly so as to reduce the cost and the time of the photo lithography and etching process.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

FIG. 4A to FIG. 4I are cross-sectional diagrams of the procedures of forming a thin film transistor according to an embodiment of the present invention.

DESCRIPTION OF THE EMBODIMENTS

FIG. 2A to FIG. 2F are cross-sectional diagrams of the procedures of forming a polysilicon film according to an embodiment of the present invention.

The method for fabricating polysilicon film of the present invention, for example, includes the following steps. First, referring to FIG. 2A, a first substrate 200 is provided, and a plurality of sunken patterns 210 has been formed on the front surface 202 of the first substrate 200.

Figure 2A:
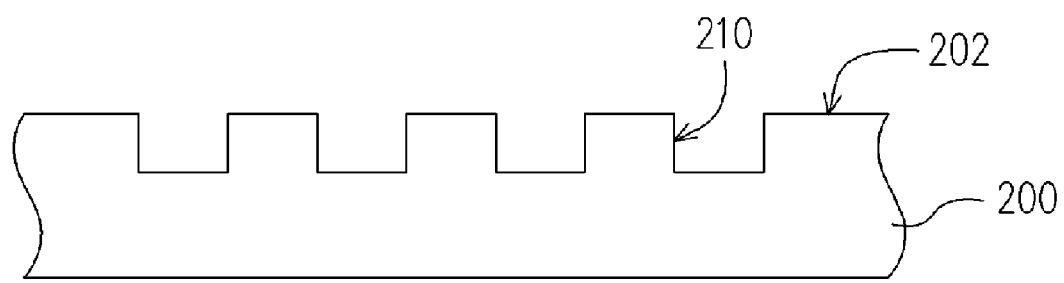
FIG. 2A to FIG. 2F are cross-sectional diagrams of the procedures of forming a polysilicon film according to an embodiment of the present invention.
Figure 3A:
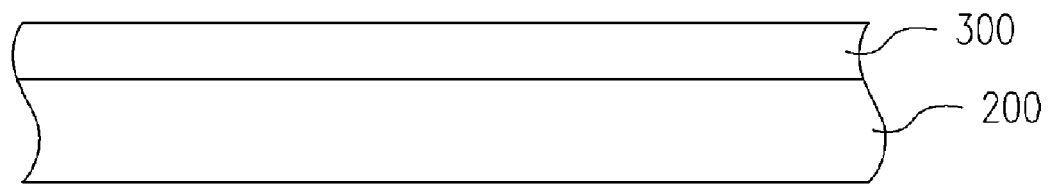
FIG. 3A to FIG. 3C are cross-sectional diagrams of the procedures of forming the sunken patterns on the front surface of the first substrate according to an embodiment of the present invention.
Figure 3B:
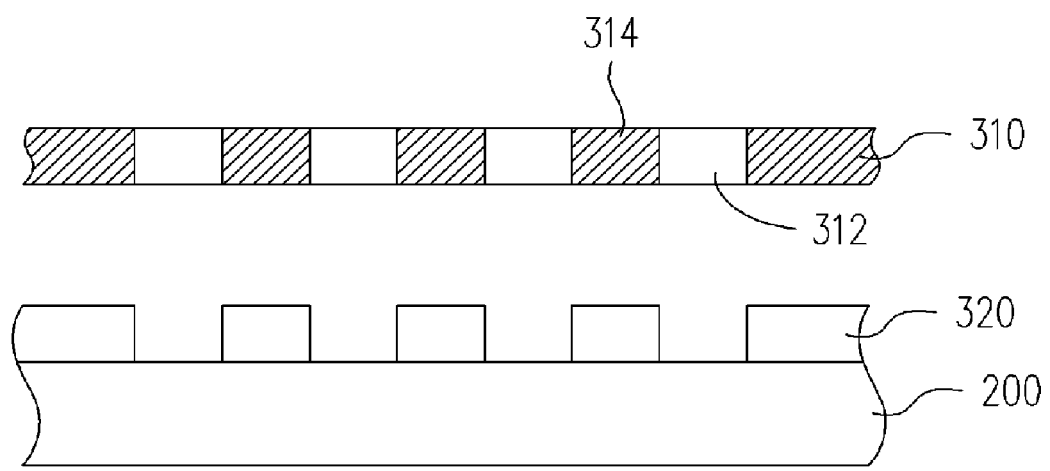
Figure 3C:
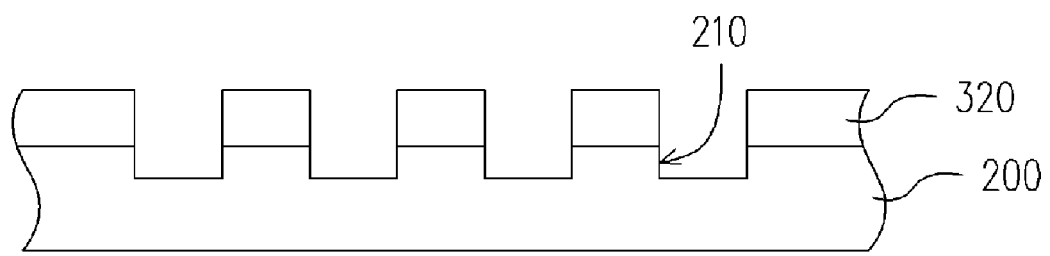

According to an embodiment of the present invention, the method for fabricating the plurality of sunken patterns 210 on the front surface 202 of the first substrate 200 includes the steps shown in FIG. 3A to FIG. 3C. Referring to FIG. 3A, a photo-resist layer 300 is formed on the first substrate 200. Then, referring to FIG. 3B, a photo lithography process using a photo mask 310 is performed so as to form a patterned photo-resist layer 320. The photo mask 310 has a plurality of transparent regions 312 and a plurality of opaque regions 314. As the photo-resist layer 300 is a positive photo-resist, the photo-resist layer 300 after being exposed and developed is removed and formed a patterned photo-resist layer 320 as shown in FIG. 3B. Naturally, the photo-resist layer 300 can be a negative photo-resist. Referring to FIG. 3C, the first substrate 200 is etched by using the patterned photo-resist layer 320 as the mask to form the sunken patterns 210. Then, the patterned photo-resist layer 320 is removed so as to obtain the first substrate 200 with the sunken patterns 210 as shown in FIG. 2A.

Moreover, according to an embodiment of the present invention, the material of the first substrate 200 is selected from the group consisting of silicon materials, metal materials or one of the combinations thereof. Wherein, the silicon material, for example, is polysilicon or wafer Si and the metal material, for example, is nickel (Ni) or aluminum (Al).

Figure 2B:

Referring to FIG. 2B, a second substrate 220 is provided. It should be noted that the second substrate 220 must be a transparent substrate, so that the laser (as shown in FIG. 2E) can pass through for performing a laser annealing process from the reverse side. According to an embodiment of the present invention, the material of the second substrate 220, for example, is glass or quartz.

Figure 2C:
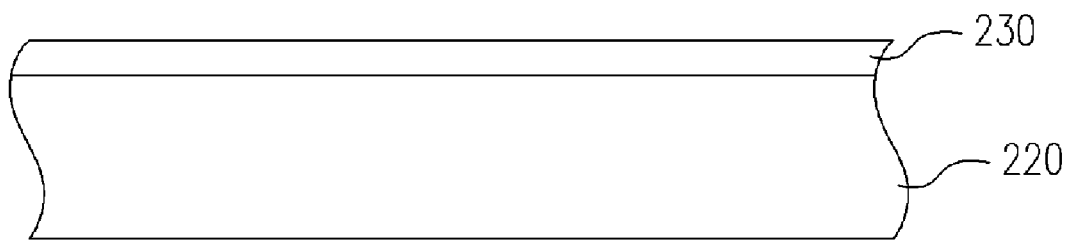

Further, referring to FIG. 2C, an amorphous silicon film 230 is formed on the second substrate 220. According to an embodiment of the present invention, the method for forming the amorphous silicon film 230 on the second substrate 220 may be chemical vapor deposition (CVD) method or plasma enhanced CVD (PECVD) method.

Figure 2D:
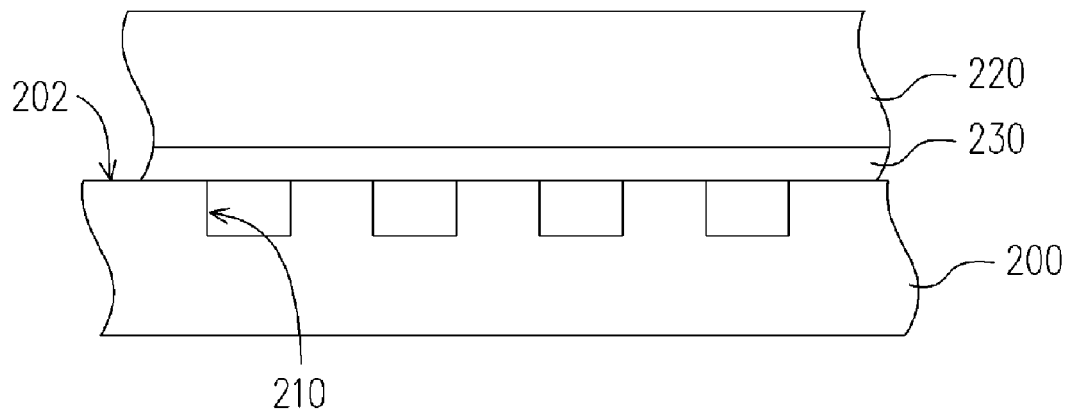
Figure 2E:
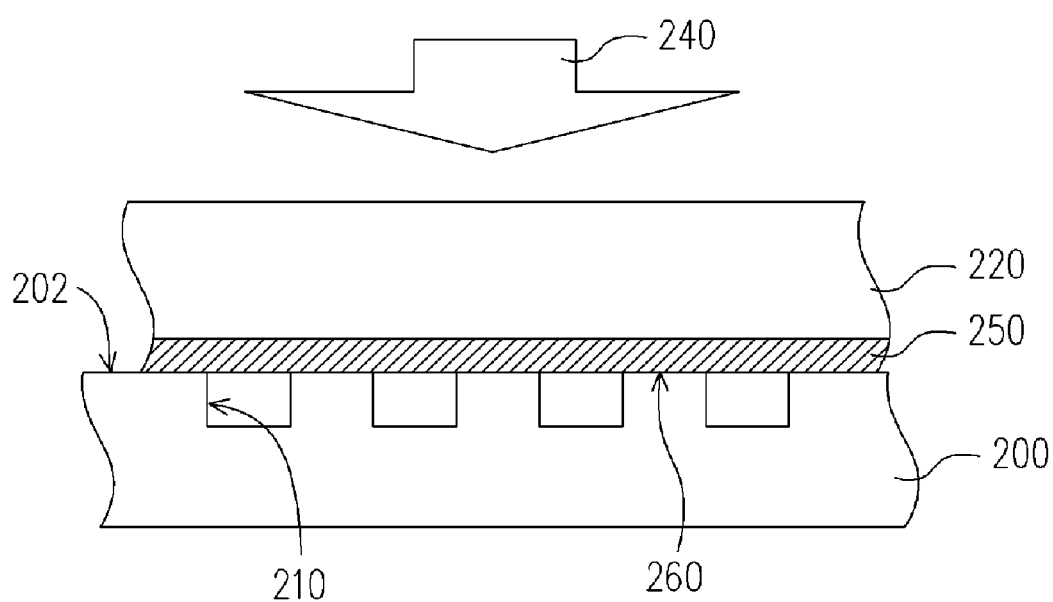

Referring to FIG. 2D and FIG. 2E at the same time, the amorphous silicon film 230 formed on the second substrate 220 is in contact with the front surface 202 of the first substrate 200. As shown in FIG. 2E, the amorphous silicon film 230 is transferred into a polysilicon film 250 by performing an annealing process 240. According to an embodiment of the present invention, the annealing process 240 may be an excimer laser annealing (ELA) process, and the heat conductive factor of the first substrate 200 is larger than that of the amorphous silicon film 230.

In more detail, the first substrate 200 with sunken patterns 210 is regarded as a seed layer substrate. Since the heat conductive factor of the first substrate 200 is larger than that of the amorphous silicon film 230, there will be a temperature gradient at the contact position 260 between the first substrate 200 and the amorphous silicon film 230 formed on the second substrate 220 during the annealing process 240. Thus, the amorphous silicon film 230 at the contact position 260 proceeds with the heterogeneous growth crystallizing process by using the first substrate 200 as crystal seed. During the crystallizing process, the crystal grows from the contact position 260 to the sunken patterns 210 beside the contact position 260 until formation of the polysilicon film 250 is completed.

Figure 1A:
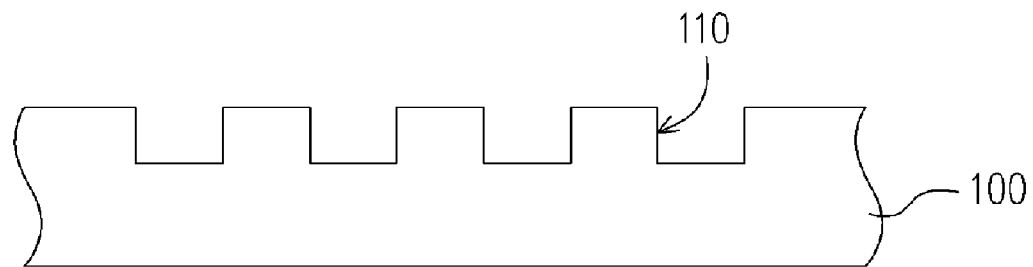
FIG. 1A to FIG. 1E are cross-sectional diagrams of the procedures of using conventional heterogeneous growth method to form polysilicon film.
Figure 1B:
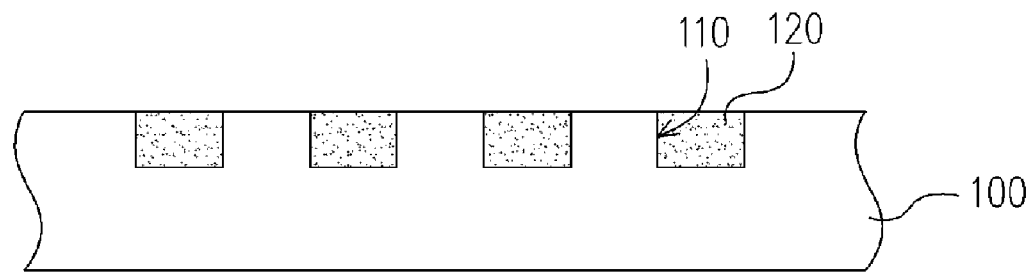
Figure 1C:
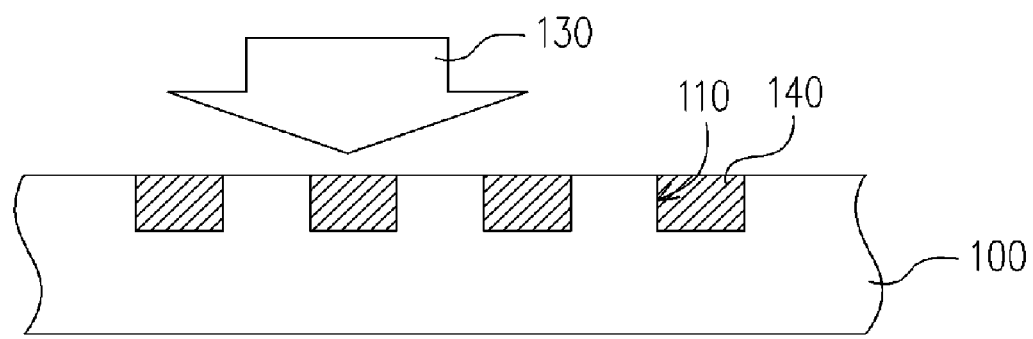
Figure 1D:
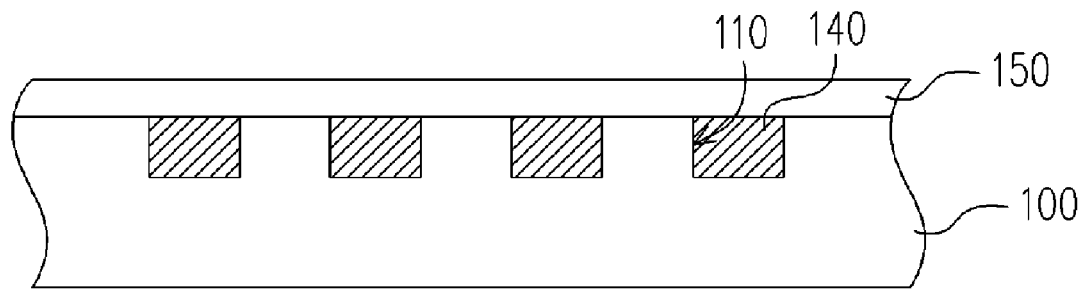
Figure 1E:
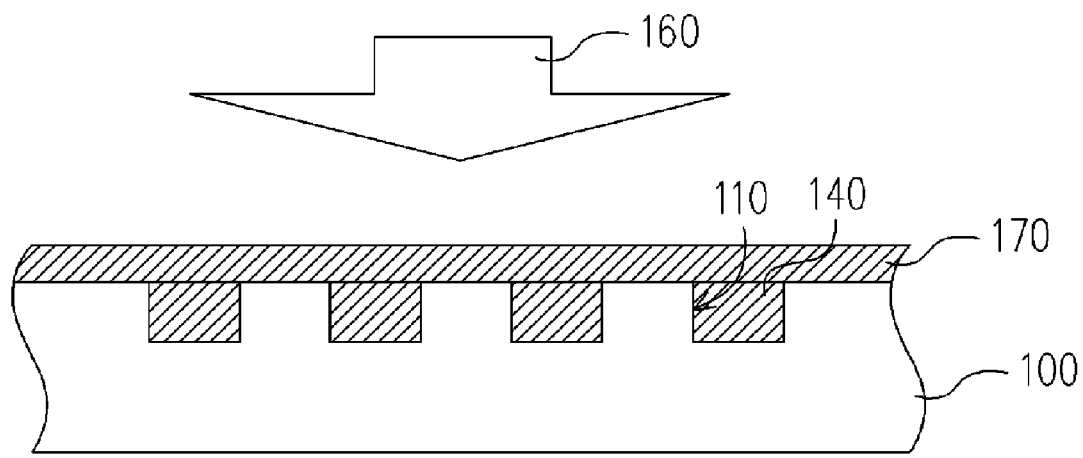
Figure 2F:
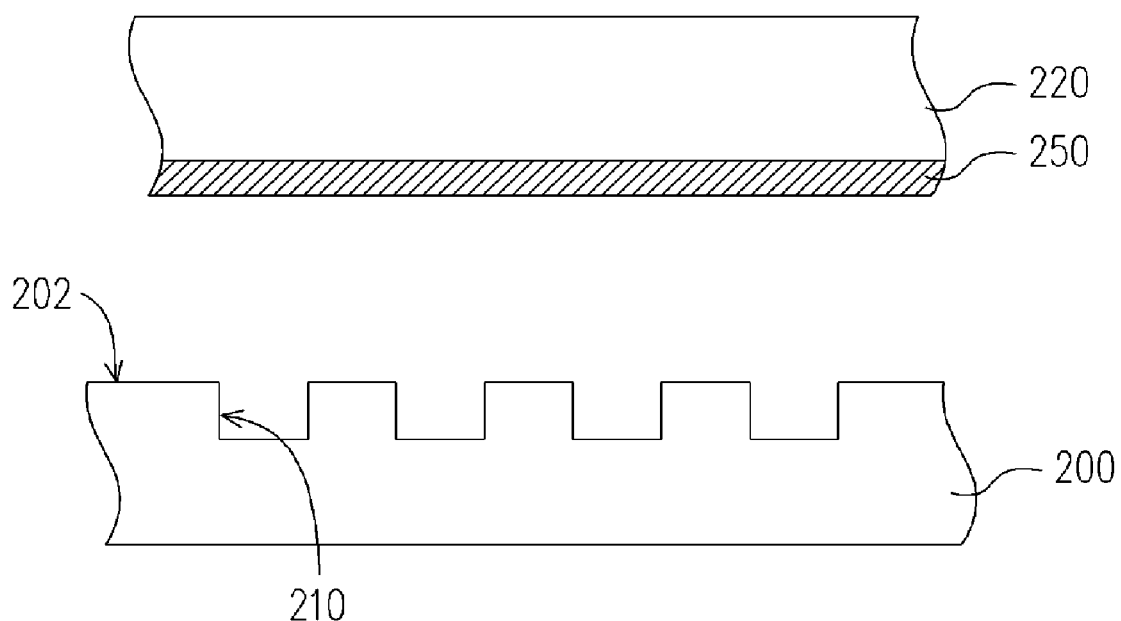

Referring to FIG. 2F, the first substrate 200 and the second substrate 220 are separated from each other. Note particularly that if the first substrate 200, which is regarded as a seed layer, and the polysilicon film 250 formed on the second substrate 220 adhered to each other during the crystallizing process, the polysilicon film 250 may be peeled off when separating the first substrate 200 and the second substrate 220. Therefore, the first substrate 200 and the polysilicon film 250 formed on the second substrate 220 can be easily separated from each other if the material of the first substrate 200 is selected appropriately as mentioned above. More specifically, the material of the first substrate 200 is preferably a metal material. In addition, the first substrate 200 regarded as a seed layer can be used repeatedly. Accordingly, compared with the conventional method, the method for fabricating polysilicon film of the present invention does not need to perform the processes shown in FIG. 1A to 1C. In other words, the photo lithography and etching process (as shown in FIG. 1A) and one-time excimer laser annealing process (as shown in FIG. 1C) are omitted from the present invention so that the manufacturing cost and time can be reduced.

In summary, the first substrate is used as a seed layer in the method for fabricating polysilicon film of the present invention so as to omit the photo lithography process and only one-time excimer laser annealing process is performed during this process. Furthermore, the first substrate used as the seed layer can be used repeatedly, so that the cost and the time of the process of the present invention can be reduced substantially.

The above-mentioned method for fabricating polysilicon film can be used in the manufacturing process of low-temperature polysilicon thin film transistors (LTPS-TFT). FIG. 4A to FIG. 4I are cross-sectional diagrams of the procedures of forming a thin film transistor according to an embodiment of the present invention.

Figure 4A:
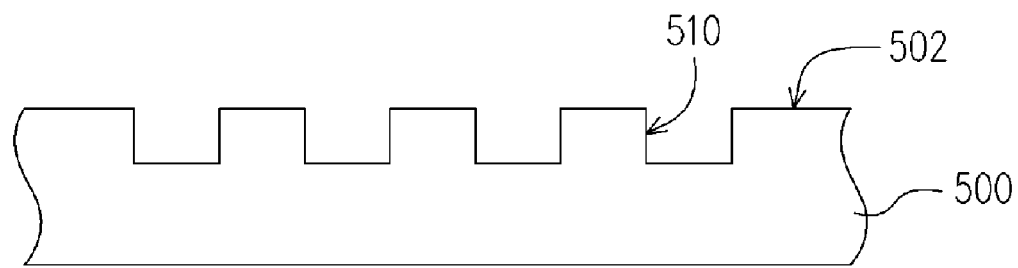

Referring to FIG. 4A, a first substrate 500 is provided, and a plurality of sunken patterns 510 has been formed on the front surface 502 of the first substrate 500. According to an embodiment of the present invention, the material of the first substrate 500 is selected from the group consisting of silicon materials, metal materials or one of the combinations thereof. Wherein, the silicon material, for example, is polysilicon or wafer Si; the metal material, for example, is nickel (Ni) or aluminum (Al). In addition, the method for forming the plurality of sunken patterns 510 is similar to the photo lithography and etching process mentioned in FIG. 3A to FIG. 3C, so the description is omitted here.

Figure 4B:
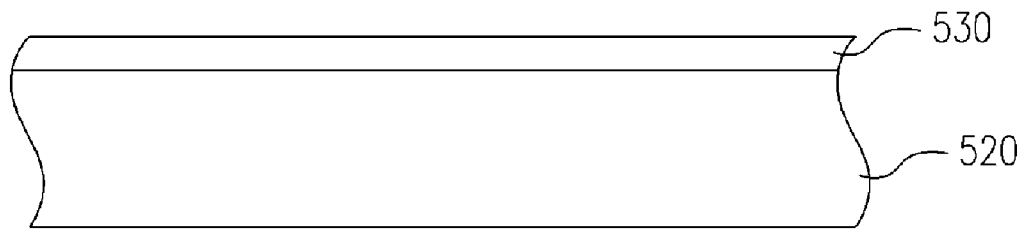

Referring to FIG. 4B, a second substrate 520 is provided, and an amorphous silicon film 530 is formed on the second substrate 520. According to an embodiment of the present invention, the material of the second substrate 520, for example, is glass or quartz and the method for forming the amorphous silicon film 530, for example, is chemical vapor deposition (CVD) method or plasma enhanced CVD (PECVD) method.

Figure 4C:
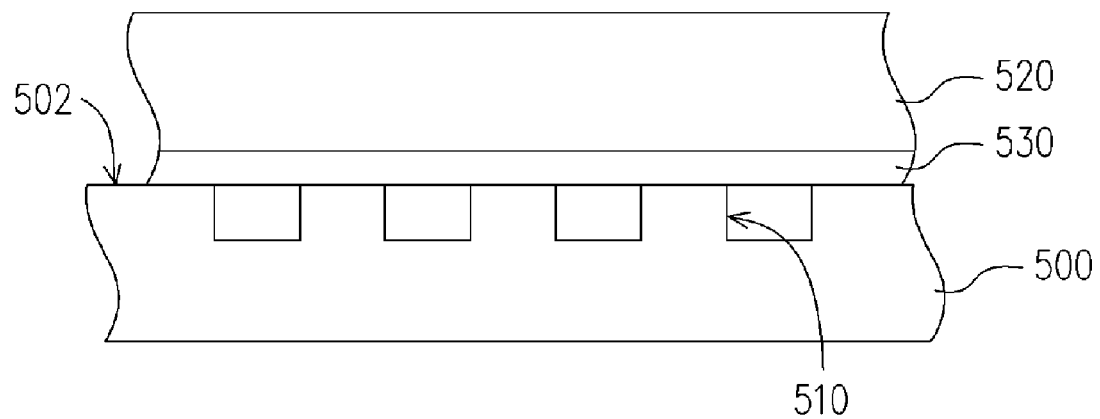
Figure 4D:
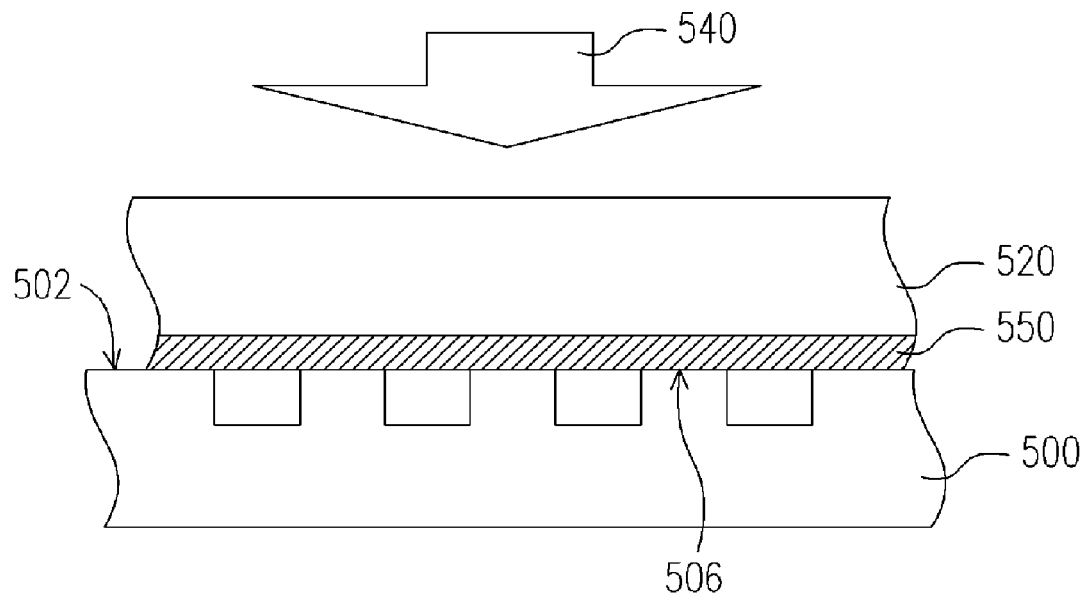
Figure 4E:
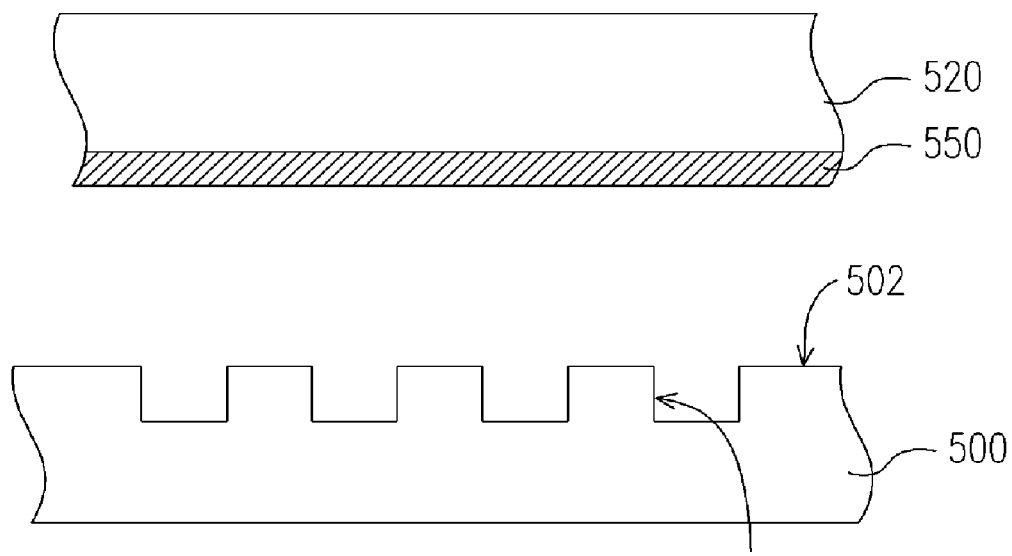

Referring to FIG. 4C and FIG. 4D at the same time, the amorphous silicon film 530 formed on the second substrate 520 is in contact with the front surface 502 of the first substrate 500 and an annealing process is performed continuously so as to transfer the amorphous silicon film 530 into a polysilicon film 550. According to an embodiment of the present invention, the annealing process 540 may be an excimer laser annealing (ELA) process. Furthermore, since the heat conductive factor of the first substrate 500 is larger than that of the amorphous silicon film 530, there will be a temperature gradient at the contact position 560 between the first substrate 500 and the amorphous silicon film 530 formed on the second substrate 520. As a result, the amorphous silicon film 530 at the contact position 560 proceeds with the heterogeneous growth crystallizing process by using the first substrate 500 as crystal seed. Then, referring to FIG. 4E, the first substrate 500 is separated from the second substrate 520.

Figure 4F:
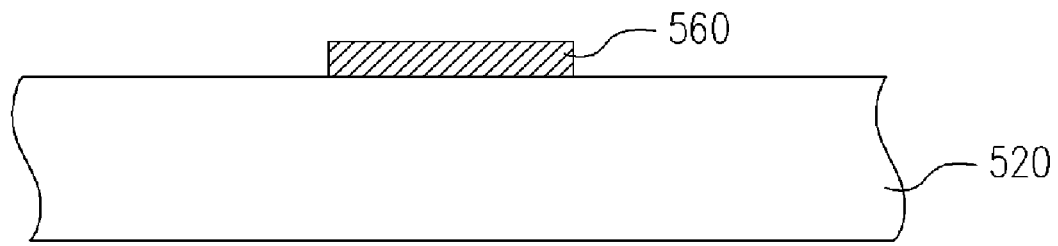

Referring to FIG. 4F, the polysilicon film 550 formed on the second substrate 520 is patterned to form a polysilicon island 560. Wherein, the patterning method is the known photo lithography and etching process that may be performed by those skilled in the art and the description is omitted here.

Figure 4G:
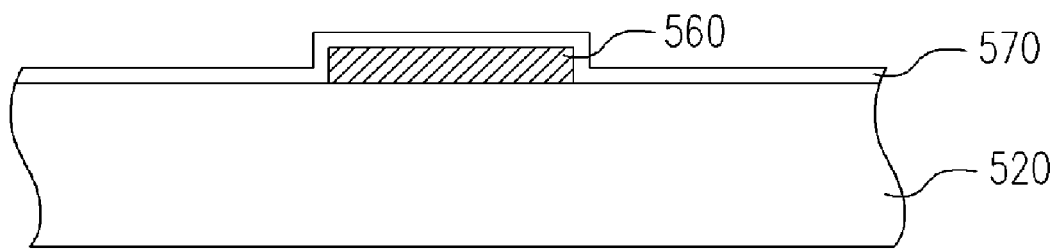

Referring to FIG. 4G, a gate insulating layer 570 is formed to cover the polysilicon island 560. According to an embodiment of the present invention, the method for forming the gate insulating layer 570 may be chemical vapor deposition (CVD) method or plasma enhanced CVD (PECVD) method, and the material of the gate insulating layer 570 may be silicon oxide or silicon nitride.

Figure 4H:
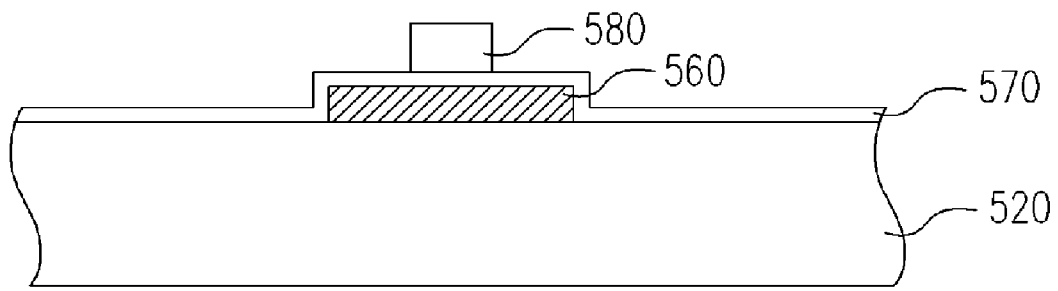
Figure 41:
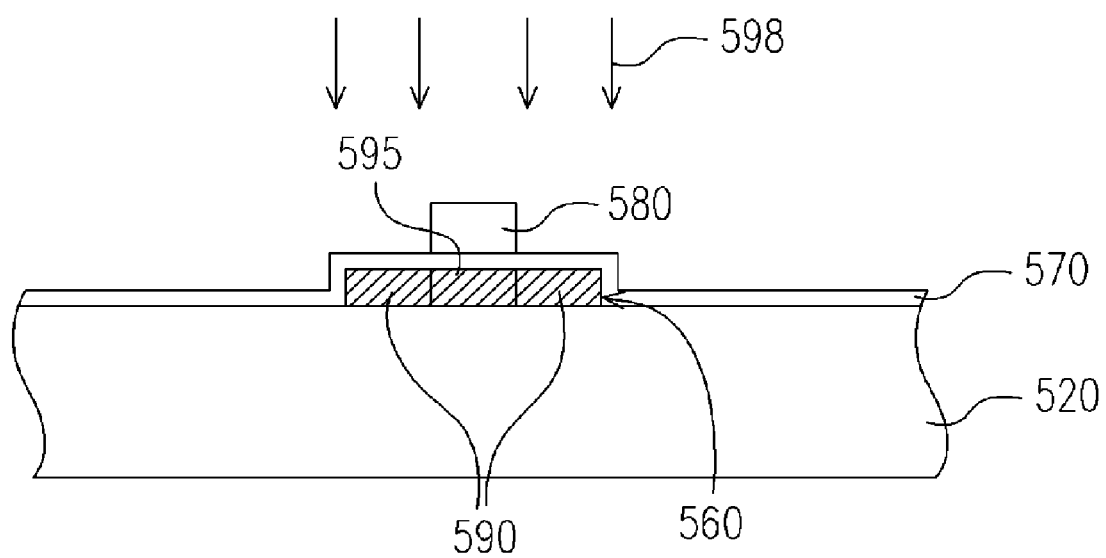

Referring to FIG. 4H, a gate 580 is formed on the gate insulating layer 570. The steps of forming the gate 580 are, for example, first a gate metal layer (not shown) is deposited completely; a known photo lithography and etching process is then performed. Or, the gate 580 may be deposited on the gate insulating layer 570 incorporating with a coating process using a shadow mask (not shown). The detailed description is omitted here as those skilled in the art can easily perform the process.

Referring to FIG. 4I, a source/drain 590 is formed in the polysilicon island 560 beside the gate 580, wherein the region between the source and drain is a channel 595. The method for forming the source/drain 590 is, for example, an ion implantation process 598 using the gate 580 as a self-aligned mask for implanting doped ions into the polysilicon island 560.

Figure 5A:
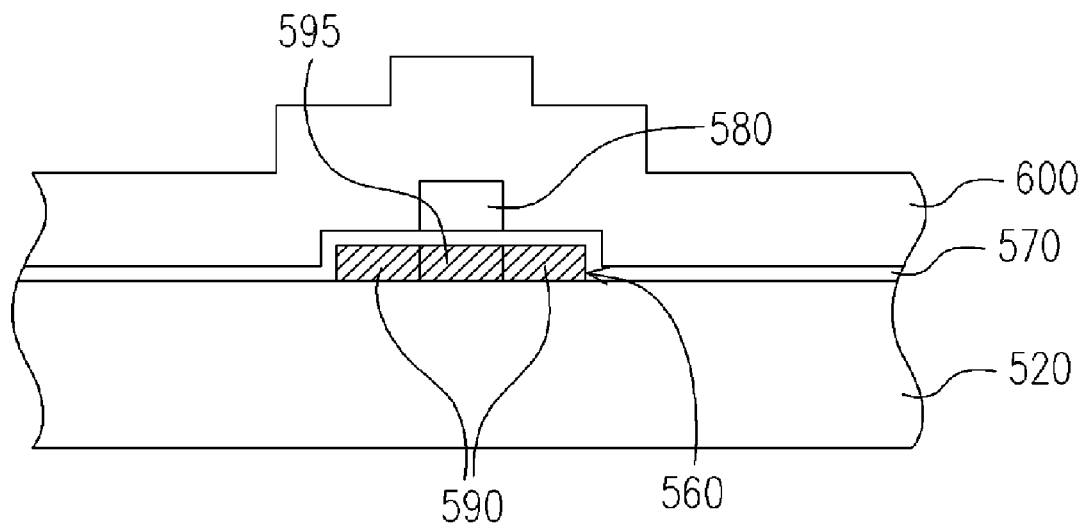
FIG. 5A to FIG. 5C are cross-sectional diagrams of the procedures of forming the passivation layer and the source/drain metal layer over the thin film transistor according to an embodiment of the present invention.
Figure 5B:
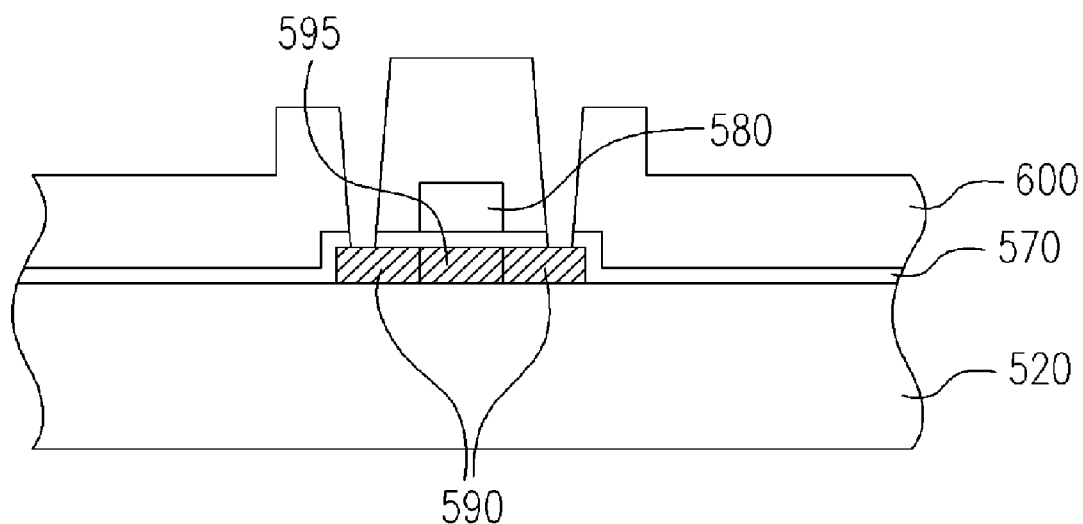
Figure 5C:
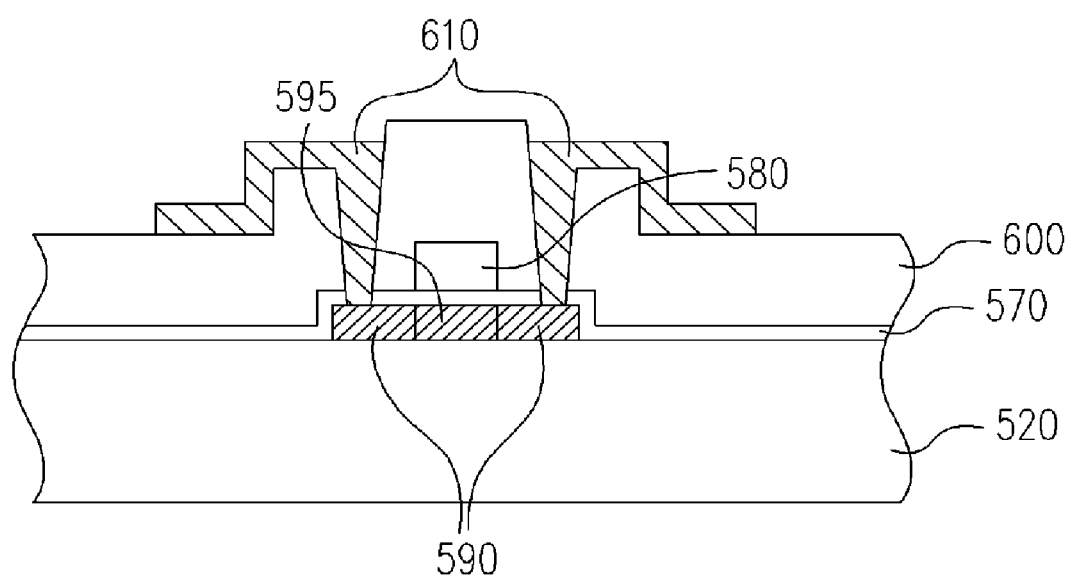

According to an embodiment of the present invention, the foregoing method for fabricating the thin film transistor, for example, further includes the steps as shown in FIG. 5A to FIG. 5C. First, referring to FIG. 5A, a passivation layer 600 is formed to cover the polysilicon island 560 and gate 580. The method for forming the passivation layer 600 is, for example, chemical vapor deposition (CVD) method or plasma enhanced CVD (PECVD) method; the material of the passivation layer 600 is, for example, silicon nitride. Referring to FIG. 5B, the passivation layer 600 is patterned to expose the source/drain 590. Wherein, the patterning method is the known photo lithography and etching process, so the description is omitted here. Referring to FIG. 5C, a source/drain metal layer 610 is formed on the passivation layer 600, wherein the source/drain metal layer 610 is electrically connected with the exposed source/drain 590.

In summary, the fabricating methods of polysilicon film and the thin film transistors of the present invention have the following advantages:

The first substrate used as the seed layer may be used repeatedly so as to reduce the cost and the time of the photo lithography and etching process. In addition, the present invention achieves the manufacturing process of the polysilicon film by only using one-time excimer laser annealing process compared with the conventional manufacturing process.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A method for fabricating polysilicon film, comprising:
   providing a first substrate, wherein a plurality of sunken patterns has been formed on a front surface of the first substrate and the material of the first substrate is selected from metal materials;
   providing a second substrate;
   forming an amorphous silicon film on the second substrate;
   making the amorphous silicon film formed on the second substrate be in contact with the front surface of the first substrate;
   transferring the amorphous silicon film into a polysilicon film by performing an annealing process; and
   separating the first substrate and the second substrate from each other.

2. The method for fabricating polysilicon film according to claim 1, wherein heat conductive factor of the first substrate is larger than that of the amorphous silicon film.

3. The method for fabricating polysilicon film according to claim 1, wherein the metal materials comprise nickel (Ni) or aluminum (Al).

4. The method for fabricating polysilicon film according to claim 1, wherein the material of the second substrate comprises glass or quartz.

5. The method for fabricating polysilicon film according to claim 1, wherein the annealing process comprises excimer laser annealing process.

6. The method for fabricating polysilicon film according to claim 1, wherein the steps of forming the plurality of sunken patterns on the front surface of the first substrate comprise:
   forming a photo-resist layer on the first substrate;
   forming a patterned photo-resist layer by performing a photo lithography process using a mask; and
   etching the first substrate by using the patterned photo-resist layer as mask to form the plurality of sunken patterns.

7. A method for fabricating thin film transistors, comprising:
   providing a first substrate, wherein a plurality of sunken patterns has been formed on a front surface of the first substrate;
   providing a second substrate, and forming an amorphous silicon film on the second substrate;
   making the amorphous silicon film formed on the second substrate be in contact with the front surface of the first substrate;
   transferring the amorphous silicon film into a polysilicon film by performing an annealing process;
   separating the first substrate and the second substrate from each other;
   forming a polysilicon island by patterning the polysilicon film formed on the second substrate;
   forming a gate insulating layer to cover the polysilicon island;
   forming a gate on the gate insulating layer; and
   forming a source/drain in the polysilicon island beside the gate, wherein a region between the source and the drain is a channel.

8. The method for fabricating thin film transistors according to claim 7, wherein heat conductive factor of the first substrate is larger than that of the amorphous silicon film.

9. The method for fabricating thin film transistors according to claim 7, wherein the material of the first substrate is selected from the group consisting of silicon materials, metal materials or one of the combinations thereof.

10. The method for fabricating thin film transistors according to claim 9, wherein the silicon materials comprise polysilicon or wafer Si.

11. The method for fabricating thin film transistors according to claim 9, wherein the metal materials comprise nickel (Ni) or aluminum (Al).

12. The method for fabricating thin film transistors according to claim 7, wherein the material of the second substrate comprises glass or quartz.

13. The method for fabricating thin film transistors according to claim 7, wherein the annealing process comprises excimer laser annealing process.

14. The method for fabricating thin film transistors according to claim 7, wherein the steps of forming the plurality of sunken patterns on the front surface of the first substrate comprise:
   forming a photo-resist layer on the first substrate;
   forming a patterned photo-resist layer by performing a photo lithography process using a mask; and
   etching the first substrate by using the patterned photo-resist layer as mask to form the plurality of sunken patterns.

15. The method for fabricating thin film transistors according to claim 7, further comprising:
   forming a passivation layer to cover the gate and the polysilicon island;
   patterning the passivation layer to expose the source/drain; and
   forming a source/drain metal layer on the passivation layer, wherein the source/drain metal layer is electrically connected with the exposed source/drain.

* * * * *